(12) United States Patent
Matsudai et al.

(10) Patent No.: US 7,998,849 B2
(45) Date of Patent: Aug. 16, 2011

(54) SEMICONDUCTOR DEVICE USED AS HIGH-SPEED SWITCHING DEVICE AND POWER DEVICE

(75) Inventors: Tomoko Matsudai, Tokyo (JP); Norio Yasuhara, Kawasaki (JP); Yusuke Kawaguchi, Miura-gun (JP); Kenichi Matsushita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/716,352

(22) Filed: Mar. 3, 2010

(65) Prior Publication Data

US 2010/0159659 A1  Jun. 24, 2010

Related U.S. Application Data

(62) Division of application No. 11/505,337, filed on Aug. 17, 2006, now Pat. No. 7,692,242.

(30) Foreign Application Priority Data

Aug. 18, 2005  (JP) ................................. 2005-237763

(51) Int. Cl.
    *H01L 21/336* (2006.01)
(52) U.S. Cl. ........ 438/525; 438/291; 438/289; 438/217; 257/E21.417
(58) Field of Classification Search .................. 438/301, 438/286, 291, 289, 525, 217; 257/E21.417
    See application file for complete search history.

(56) References Cited

U.S. PATENT DOCUMENTS

| | | | |
|---|---|---|---|
| 6,620,667 B2 | 9/2003 | Kim et al. | |
| 6,727,127 B1* | 4/2004 | Darmawan et al. | 438/197 |
| 7,323,731 B2 | 1/2008 | Yuzurihara et al. | |
| 2004/0108548 A1 | 6/2004 | Cai | |
| 2004/0173846 A1 | 9/2004 | Hergenrother et al. | |
| 2004/0241950 A1* | 12/2004 | Olofsson | 438/301 |
| 2008/0315305 A1 | 12/2008 | Matsudai et al. | |
| 2009/0032869 A1 | 2/2009 | Matsudai et al. | |

FOREIGN PATENT DOCUMENTS

JP  06-291309  10/1994
(Continued)

OTHER PUBLICATIONS

Office Action issued Mar. 1, 2011, in Japanese Patent Application No. 2005-237763 (with English-language Translation).

*Primary Examiner* — Ngan Ngo
*Assistant Examiner* — Benjamin Tzu-Hung Liu
(74) *Attorney, Agent, or Firm* — Oblon, Spivak, McClelland, Maier & Neustadt, L.L.P.

(57) ABSTRACT

A low resistance layer is formed on a semiconductor substrate, and a high resistance layer formed on the low resistance layer. A source region of a first conductivity type is formed on a surface region of the high resistance layer. A drain region of the first conductivity type is formed at a distance from the source region. A first resurf region of the first conductivity type is formed in a surface region of the high resistance layer between the source region and the drain region. A channel region of a second conductivity type is formed between the source region and the first resurf region. A gate insulating film is formed on the channel region, and a gate electrode formed on the gate insulating film. An impurity concentration in the channel region under the gate electrode gradually lowers from the source region toward the first resurf region.

4 Claims, 6 Drawing Sheets

FOREIGN PATENT DOCUMENTS

| | | |
|---|---|---|
| JP | 06-310717 | 11/1994 |
| JP | 10-32330 | 2/1998 |
| JP | 10-070196 | 3/1998 |
| JP | 2002-158353 | 5/2002 |
| JP | 2004-63844 | 2/2004 |
| JP | 2004-516652 | 6/2004 |
| WO | WO 02/49092 A1 | 6/2002 |
| WO | WO 2004/042826 A2 | 5/2004 |

* cited by examiner

SEMICONDUCTOR DEVICE USED AS HIGH-SPEED SWITCHING DEVICE AND POWER DEVICE

CROSS-REFERENCE TO RELATED APPLICATIONS

This application in a division of U.S. patent application Ser. No. 11/505,337, filed on Aug. 17, 2006, which is based upon and claims the benefit of priority from prior Japanese Patent Application No. 2005-237763, filed Aug. 18, 2005, the entire contents of each of which are incorporated herein by reference.

BACKGROUND OF THE INVENTION

1. Field of the Invention

The present invention relates to a semiconductor device used as a high-speed switching device and a power device, for example, a lateral MOS field effect transistor (hereinafter referred to as a lateral MOSFET).

2. Description of the Related Art

In recent years, development of lateral MOSFETs (LD-MOSs) has advanced (see, for example, Jpn. PCT National Publication No. 2004-516652). For the purpose of a high-speed operation, it is required to reduce the capacitance between a gate and a drain, and a structure that satisfies the requirement has been considered. More specifically, the following measures have been considered: (1) to reduce the overlap between a gate and a resurf layer; (2) to make the conductivity type of a region under a gate opposite to that of a drain (for example, in the case of an N-channel MOSFET, a P-type region is formed under the gate); and (3) to shorten the gate length.

When the structure is employed, in which the overlap between a gate and a drain is minimized in order to reduce the gate length and to reduce the capacitance between a gate and a drain, the following problems arise in forming a channel region.

In general, in the case of a CMOS structure, ion implantation (channel ion implantation) is performed on the overall semiconductor region surface, that is, in both source and drain regions, in order to form a channel region to control a threshold voltage. Thus, the channel concentration in a region under a gate is substantially uniform. In contrast, a lateral MOSFET has a so-called resurf region between a channel region and a drain region to keep the breakdown voltage high. The resurf region on the drain side has a lower impurity concentration and a longer length as compared to a lightly doped diffusion region (LDD) on the source side. Therefore, in the lateral MOSFET, if channel ion implantation is performed on the overall semiconductor region surface, that is, in both source and drain regions, as in the case of a CMOS, the device characteristics may be adversely affected. For example, the effective concentration of a resurf region may be lowered, or the drain region and the channel region form a pn junction portion at a high concentration. Further, if channel ion implantation is selectively performed by using a mask so that impurity ions are not implanted in the resurf region by the channel ion implantation, the displacement of the mask may significantly influence variations of the device characteristics.

BRIEF SUMMARY OF THE INVENTION

According to a first aspect of the present invention, there is provided a semiconductor device comprising a low resistance layer formed on a semiconductor substrate; a high resistance layer formed on the low resistance layer; a source region of a first conductivity type formed on a surface region of the high resistance layer; a drain region of the first conductivity type formed at a distance from the source region; a first resurf region of the first conductivity type formed in a surface region of the high resistance layer between the source region and the drain region; a channel region of a second conductivity type formed between the source region and the first resurf region; a gate insulating film formed on the channel region; and a gate electrode formed on the gate insulating film, wherein an impurity concentration in the channel region under the gate electrode gradually lowers from the source region toward the first resurf region.

According to a second aspect of the present invention, there is provided a method for manufacturing a semiconductor device, comprising: forming a gate insulating film on a semiconductor region; forming a gate electrode on the gate insulating film; covering a drain region forming part of the semiconductor region with a protecting film, and performing ion implantation obliquely on the semiconductor region from a side of a source region forming part of the semiconductor region, thereby forming a channel region in a part of the semiconductor region under the gate electrode; covering the source region forming part of the semiconductor region with a protecting film, and performing ion implantation on the semiconductor region, thereby forming a resurf region; and covering the resurf region with a protecting film, and performing ion implantation on the semiconductor region, thereby forming a source region and a drain region.

DETAILED DESCRIPTION OF THE INVENTION

Figure 1:
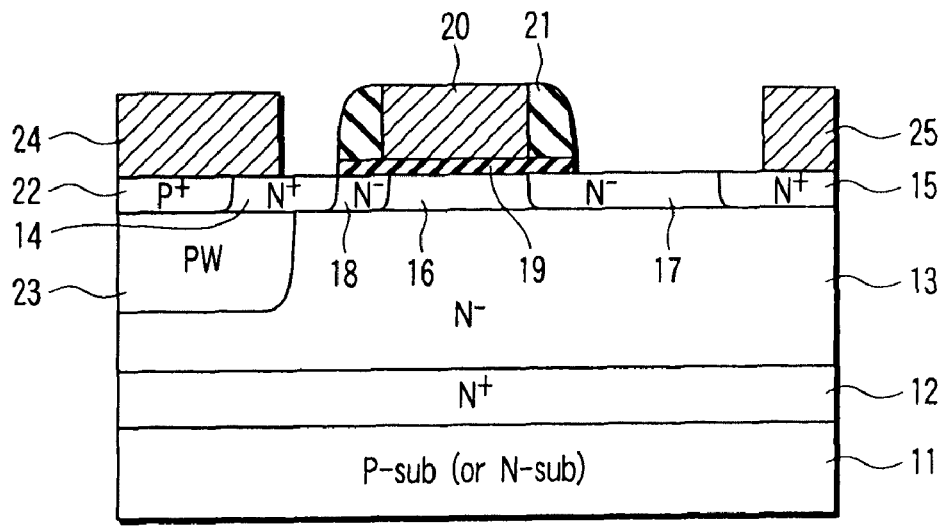
FIG. 1 is a cross-sectional view showing a lateral MOSFET according to a first embodiment of the present invention.

A semiconductor device according to embodiments of the present invention will be described with reference to the accompanying drawings. In the following description, one reference numeral is used to designate the same parts throughout the figures.

First Embodiment

FIG. 1 is a cross-sectional view showing a lateral MOSFET according to a first embodiment. FIG. 1 shows an N-type (N-channel) MOSFET. Since this type of MOSFET is intended for a high-speed operation, it is designed to reduce the capacitance between a gate and a drain; more specifically, to reduce the overlap between a gate and a resurf region or to reduce the gate length.

The structure of the lateral MOSFET shown in FIG. 1 will now be described. An N+-type semiconductor layer 12 as a low resistance layer is formed on a P-type (or N-type) silicon semiconductor substrate 11. An N–-type semiconductor layer 13 as a high resistance layer is formed on the N+-type semiconductor layer 12. An N+-type source region 14 and an N+-type drain region 15 are formed with a predetermined distance therebetween in a surface region of the N–-type semiconductor layer 13.

A channel region 16 is formed in a part of the N–-type semiconductor layer 13 between the N+-type source region 14 and the N+-type drain region 15. An N–-type resurf region 17 is formed between the channel region 16 and the N+-type drain region 15. An N–-type lightly doped diffusion region (LDD) 18 is formed between the channel region 16 and the N+-type source region 14.

A gate insulating film 19 is formed on the channel region 16. A gate electrode 20 is formed on the gate insulating film 19. Side wall insulating films 21 are formed on side surfaces of the gate electrode 20.

A P+-type semiconductor region 22 is formed in the vicinity of the N+-type source region 14. A P-type well region 23 is formed under the N+-type source region 14 and the P+-type semiconductor region 22. Further, a source electrode 24 is formed on the N+-type source region 14 and the P+-type semiconductor region 22, and a drain electrode 25 is formed on the N+-type drain region 15.

Figure 2:
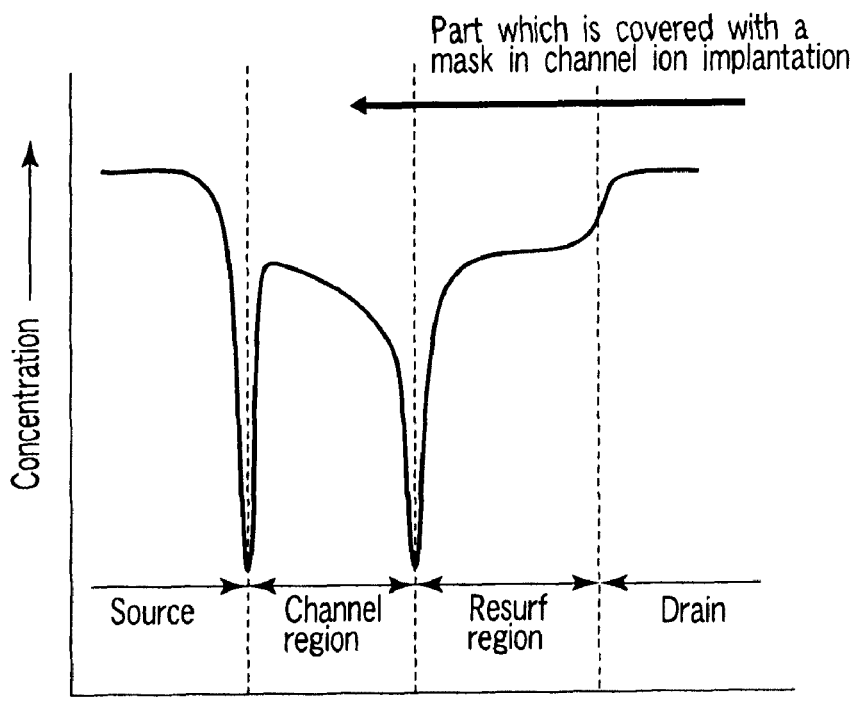
FIG. 2 is a diagram showing a profile of an impurity concentration in a channel region of the lateral MOSFET according to the first embodiment.

In the lateral MOSFET having the above structure, the channel 16 has a profile of an impurity concentration as described below. FIG. 2 shows a profile of an impurity concentration in the channel region 16 under the gate electrode 20. As shown in FIG. 2, the concentration of a p-type impurity in the channel region 16 gradually lowers from the source side to the resurf region. In other words, the channel region 16 has a concentration profile showing that the concentration of the P-type impurity continuously lowers from the source side toward the drain side.

Ion implantation to form the channel region in the lateral MOSFET shown in FIG. 1 is performed in the following manner. The ion implantation to form the channel region (channel ion implantation) is performed not on the overall semiconductor region surface unlike in the case of a CMOS, or not by using a mask covering semiconductor region surface except for a part of the gate region before forming a gate electrode, to prevent impurity ions from being implanted in the drain side. In this embodiment, after the gate electrode 20 is formed, the channel region is formed by performing oblique ion implantation from the source side, using the gate electrode 20 as a mask. More specifically, impurity ions are implanted at a predetermined angle with the normal to the surface of the semiconductor substrate from the source side, using the gate electrode 20 as a mask, with the result that the channel region 16 is formed. To prevent the impurity ions from being implanted in the drain side, a mask covering the semiconductor region surface except for a part of the gate region is used. With this mask, the channel region is formed in a self-aligning manner with respect to the gate end. Therefore, a variation of a profile in channel region due to displacement of the mask can be avoided. Further, since the ions implanted in the channel region do not enter the N+-layer on the drain side, a pn junction portion at a high concentration is not formed in the drain region. Therefore, decrease in breakdown voltage in the depth direction of semiconductor region of the device does not occur.

Figure 3A:
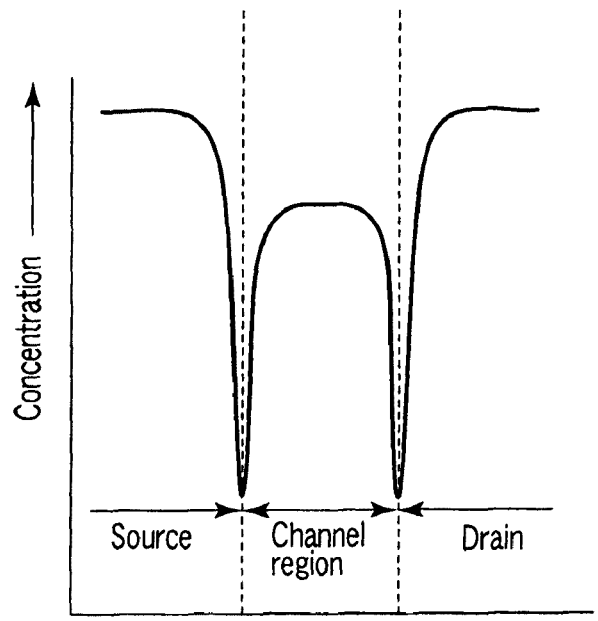
FIG. 3A is a diagram showing a profile of an impurity concentration in a channel region of a CMOS.

The channel region of the lateral MOSFET of the first embodiment and the channel region of another type of MOSFET are easily distinguishable from each other by analyzing the impurity concentration profiles in the channel regions under the gate electrodes. FIG. 3A shows a profile of an impurity concentration obtained when ion implantation is performed on the overall semiconductor region surface to form a channel region as in the case of a CMOS. In this case, the impurity concentration of the channel region under the gate electrode is constant. Note that FIG. 3A shows a case in which the source region and the drain region are formed on either side of the gate electrode, and an LDD is omitted.

Figure 3B:
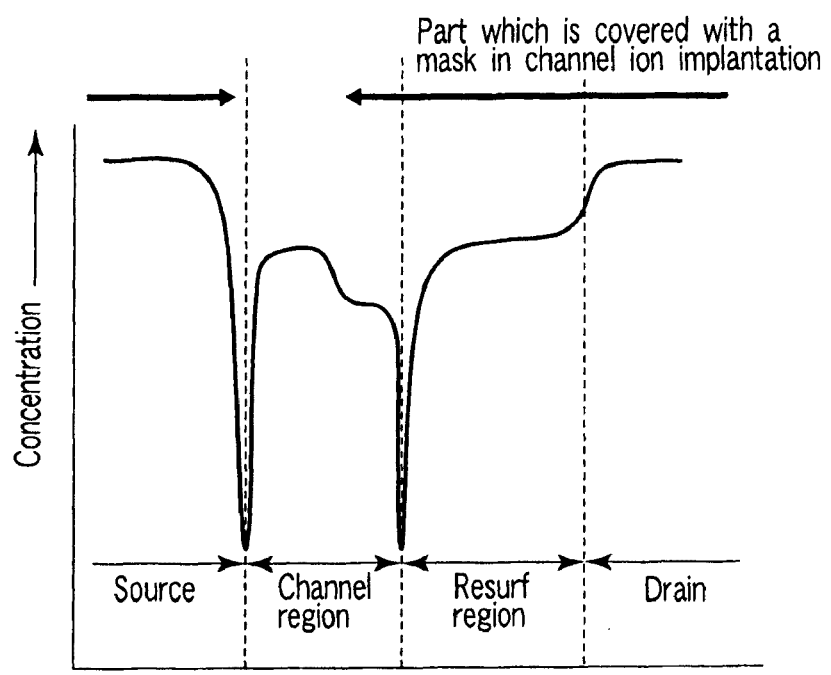
FIG. 3B is a diagram showing a profile of an impurity concentration in a case where ion implantation is selectively performed using a mask, which covers a semiconductor region surface except for a part of a gate region.
Figure 3C:
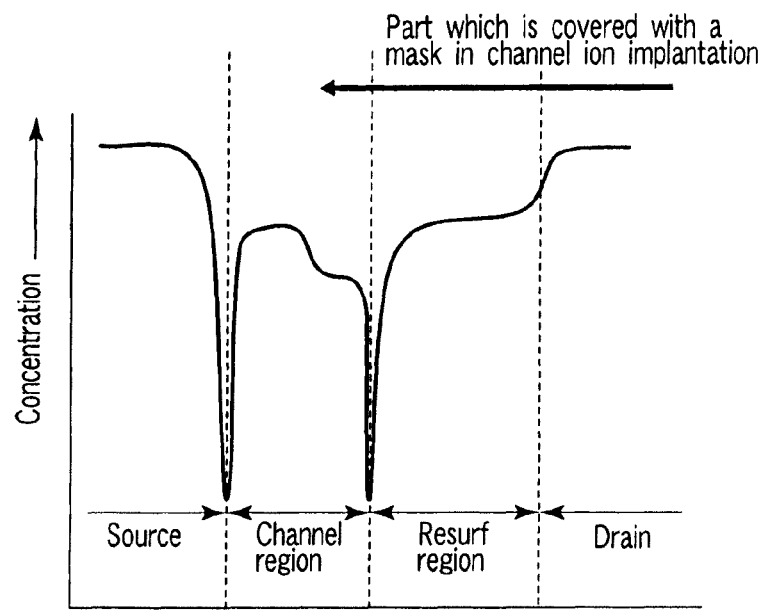
FIG. 3C is a diagram showing a profile of an impurity concentration in a case where ion implantation is selectively performed using a mask, which covers a semiconductor region surface except for a source region and a part of a gate region.

FIG. 3B shows a profile of an impurity concentration in a case where ion implantation is selectively performed using a mask, which covers the semiconductor region surface except for a part of a gate region. With this method, displacement of the mask in the gate region inevitably occurs, causing a variation in the high-impurity concentration region, which is produced by the ion implantation. As a result, device characteristics, such as a threshold voltage, vary. The variation in device characteristic is more significant in a MOSFET which has a relatively shorter channel length. Since a MOSFET intended for a high-speed operation is designed to have a short channel length, the method shown in FIG. 3B is not suitable for this type of MOSFET. Likewise, in the case shown in FIG. 3C, in which the source region is not covered by a mask, displacement of the mask in the gate region inevitably occurs, resulting in variation in device characteristic, such as a threshold voltage.

In contrast, the concentration profile shown in FIG. 2 is obtained when the channel region is formed in a self-aligning manner, using a gate electrode as a mask, which is employed in the method for manufacturing a lateral MOSFET of the first embodiment. In this case, ion implantation is carried out obliquely from the source side. Since self-alignment is employed, there is no influence of displacement of the mask on device characteristics. In addition, the concentration profile under the gate electrode can be changed by changing the acceleration energy and the angle of ion implantation. Moreover, since the gate electrode itself serves as a mask to define the position of introducing impurities, the concentration profile under the gate electrode is characterized in that it monotonously reduces from the gate end of the source side toward the gate end of the drain side. Thus, the threshold voltage is determined at the gate end of the source side where the impurity concentration is the highest. Therefore, there is no variation in threshold voltage in the MOSFET of the first embodiment. Furthermore, since the concentration gradually lowers toward the drain side, the concentration in the resurf region formed in the drain side is not influenced. Accordingly, the resurf region can be designed easily.

A method for manufacturing the lateral MOSFET of the first embodiment will be described. FIGS. 4A to 4C and FIG. 5A to 5E are cross-sectional views showing steps of a method for manufacturing the lateral MOSFET of the first embodiment.

Figure 4A:
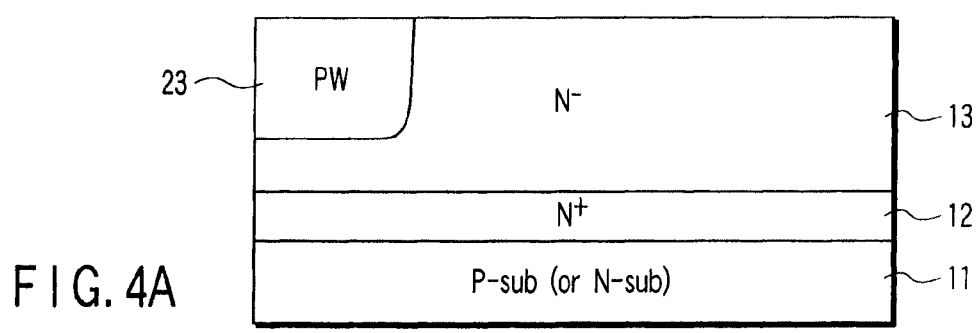
FIG. 4A is a cross-sectional view showing a first step of a method for manufacturing the lateral MOSFET of the first embodiment.

As shown in FIG. 4A, an N+-type semiconductor layer 12 as a low resistance layer is formed on a P-type (or N-type) silicon semiconductor substrate 11. Then, an N--type semiconductor layer 13 as a high resistance layer is formed on the N+-type semiconductor layer 12. Further, a P-type well region (deep diffusion layer) 23 is formed on a surface region of the N--type semiconductor layer 13 by ion implantation and thermal diffusion.

Figure 4B:
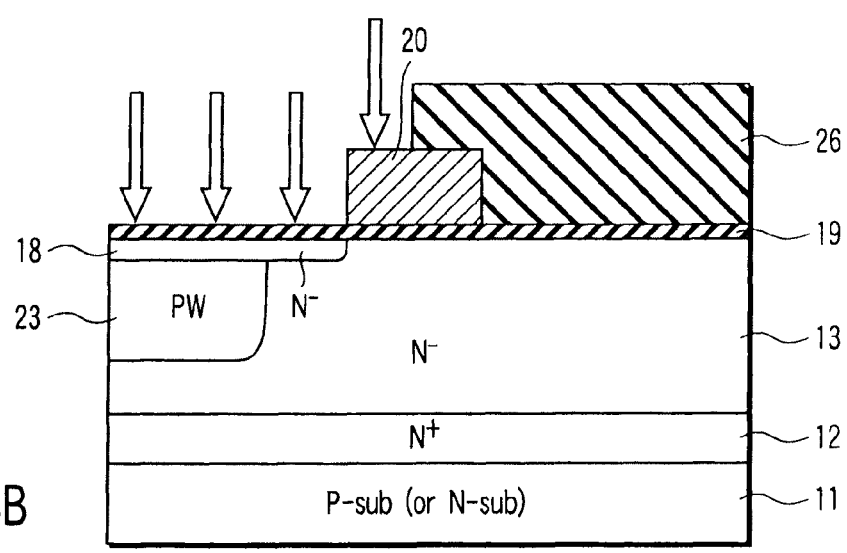
FIG. 4B is a cross-sectional view showing a second step of a method for manufacturing the lateral MOSFET of the first embodiment.

Thereafter, as shown in FIG. 4B, after a gate insulating film (for example, a silicon oxide film) 19 and a gate electrode 20 are formed, the drain region is covered with a resist film 26. Then, ion implantation is carried out to form an N--type lightly doped diffusion region (LDD) 18 only in the source side. Since the lightly doped diffusion region 18 is formed in a self-aligning manner with respect to the gate electrode 20, the angle of ion implantation is generally 0 degree. In other words, ion implantation is carried out on the semiconductor substrate along the normal to the surface or at about 7 degrees with respect to the normal.

On the assumption that a heating process after forming the gate is performed after a series of ion implantation steps, the drawings show the state of the diffusion layer before thermal diffusion.

Figure 4C:
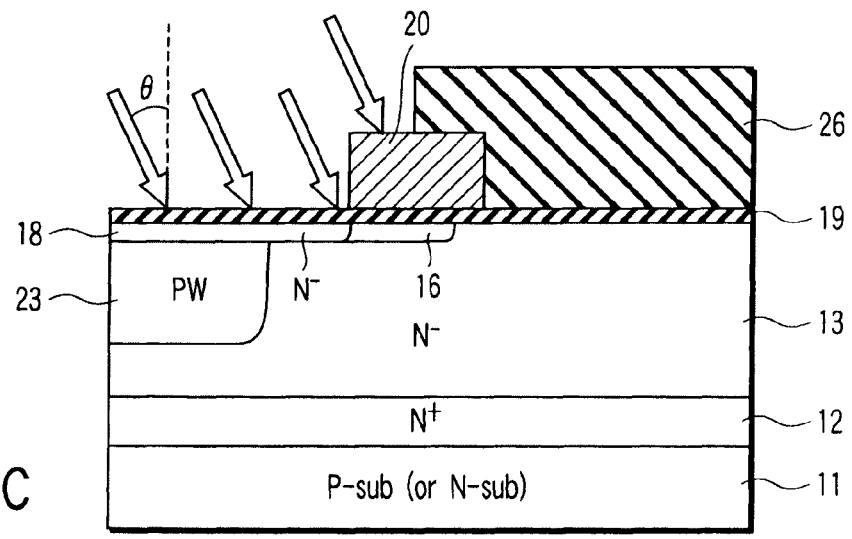
FIG. 4C is a cross-sectional view showing a third step of a method for manufacturing the lateral MOSFET of the first embodiment.

Then, as shown in FIG. 4C, ion implantation is carried out obliquely from the source region side to form a channel region 16, while the drain region is still covered with the resist film 26. More specifically, ion implantation is carried out to form a channel region 16 at an angle θ with the normal to the semiconductor substrate surface. For example, when ion implantation is carried out at an angle of 30 degrees with the normal to the semiconductor substrate surface at acceleration energy of 20 KeV, the channel region 16 extends to the drain side after thermal diffusion, if the gate length is 0.18 μm. Since FIG. 4C shows a state before thermal diffusion, the channel region 16 does not extend to the drain side. However, there is no problem even if the channel region has been extended to the drain side by the time of ion implantation.

Figure 5A:
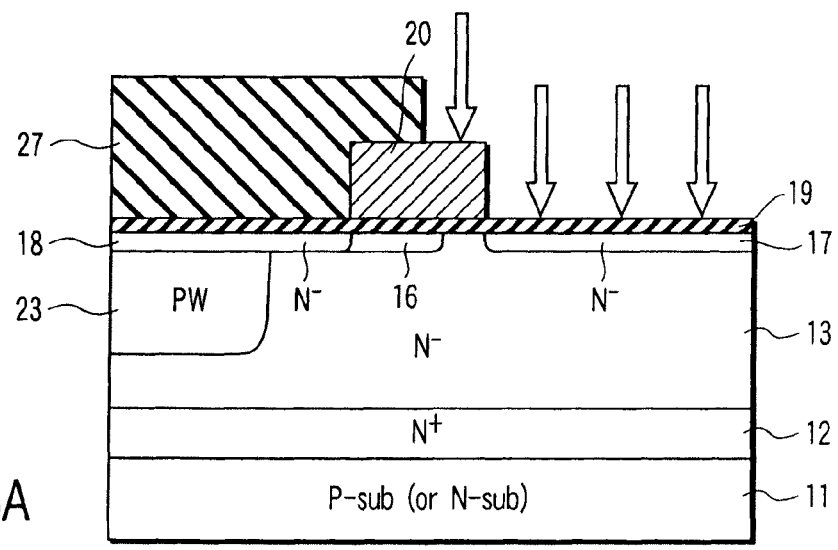
FIG. 5A is a cross-sectional view showing a fourth step of a method for manufacturing the lateral MOSFET of the first embodiment.

Then, as shown in FIG. 5A, an N--type resurf region 17 is formed by ion implantation, with a resist film 27 covering the source region side. In the step of forming the N--type resurf region 17, generally the ion implantation is carried out on the semiconductor substrate along the normal to the surface (at 0 degree) or at about 7 degrees with respect to the normal, in order to reduce the capacitance between the gate electrode 20 and the N--type resurf region 17.

Figure 5B:
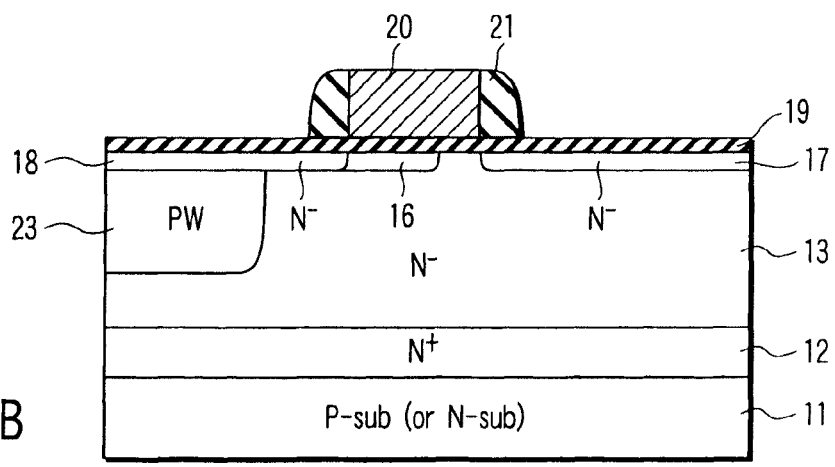
FIG. 5B is a cross-sectional view showing a fifth step of a method for manufacturing the lateral MOSFET of the first embodiment.
Figure 5C:
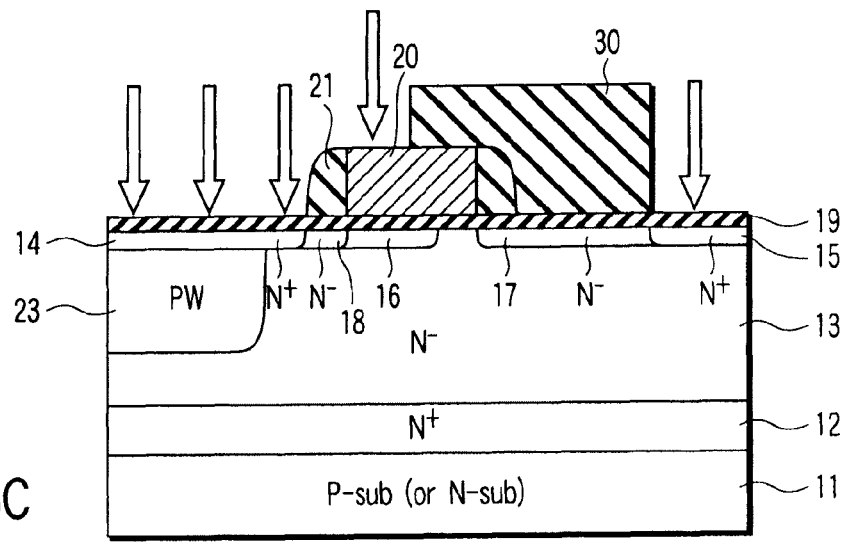
FIG. 5C is a cross-sectional view showing a sixth step of a method for manufacturing the lateral MOSFET of the first embodiment.

Thereafter, as shown in FIG. 5B, side wall insulating films 21 are formed on side surfaces of the gate electrode 20. Then, as shown in FIG. 5C, an N+-type source region 14 and an N+-type drain region 15 are formed. During this time, the N--type resurf region 17 is covered with a resist film 30, so that N+-type ions will not enter that region.

Figure 5D:
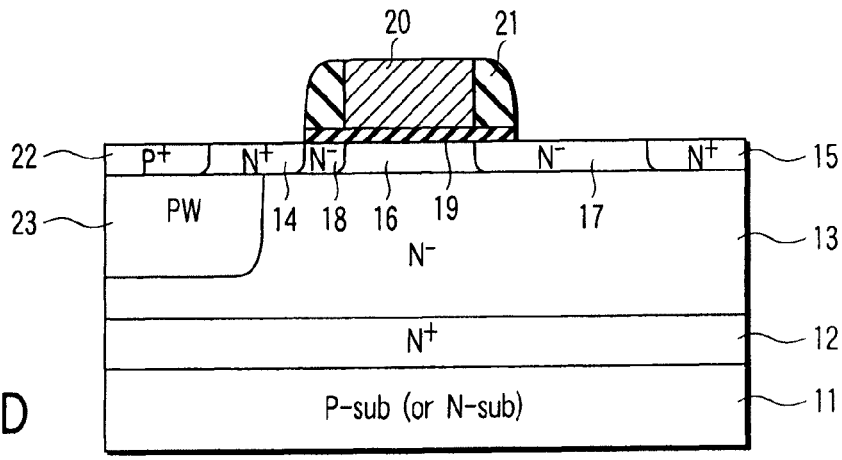
FIG. 5D is a cross-sectional view showing a seventh step of a method for manufacturing the lateral MOSFET of the first embodiment.
Figure 5E:
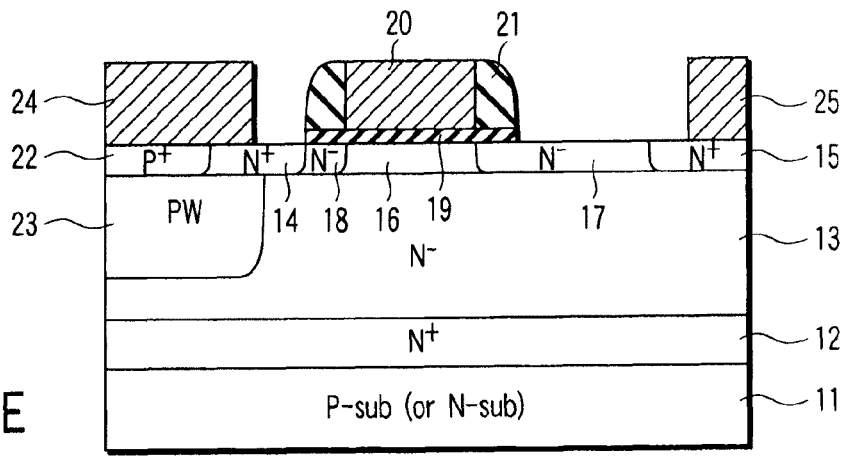
FIG. 5E is a cross-sectional view showing an eighth step of a method for manufacturing the lateral MOSFET of the first embodiment.

After forming a P+-type semiconductor region 22 by ion implantation, as shown in FIG. 5D, a heating process is performed to activate the diffusion layers. Then, as shown in FIG. 5E, a source electrode 24 and a drain electrode 25 are formed, with the result that the lateral MOSFET shown in FIG. 1 is completed.

Figure 6:
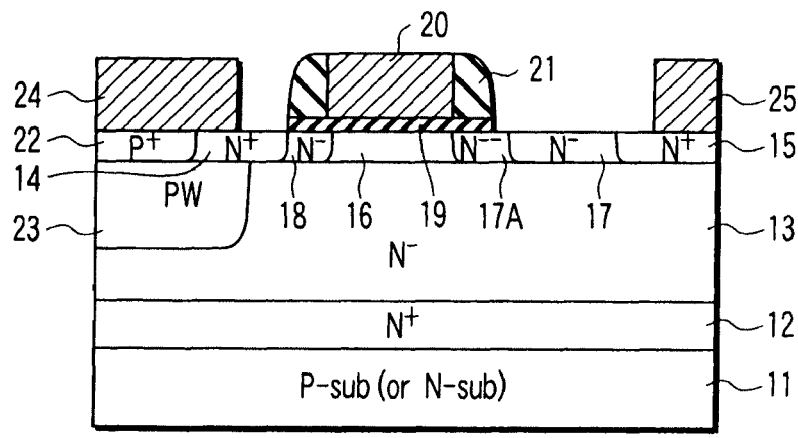
FIG. 6 is a cross-sectional view showing a lateral MOSFET according to a modification of the first embodiment.

A method for forming a channel region having the concentration profile shown in FIG. 2 will now be described in detail. The amount of extension (the length in the lateral direction) of the diffusion region (the P-type diffusion region in the case of an N-type MOSFET) formed by the oblique ion implantation can be adjusted by changing the acceleration energy and the angle of ion implantation. If the gate length is short, the angle of ion implantation is set to such an angle that the channel region extends to the drain side, using the angle of oblique ion implantation as a parameter. The impurity concentration is relatively low in a part of the resurf region which has been subjected to both the ion implantation for forming the resurf region and the ion implantation for forming the channel region. Thus, a part of the resurf region nearer to the gate region has a relatively low concentration, and a part thereof nearer to the drain region has a relatively high concentration. Thus, the N-type resurf region of a two-step structure is formed. FIG. 6 shows a cross section of a lateral MOSFET having the two-step resurf structure. As shown in FIG. 6, an N---type resurf region 17A is formed between the channel region 16 and the N--type resurf region 17.

In general, to form a resurf region of the two-step structure, ion implantation is carried out selectively on two regions by using a mask. Therefore, displacement of the mask is inevitable. Thus, the length of the resurf region to maintain a static breakdown voltage varies, and the variation in the device characteristics is increased. However, according to the method for manufacturing a lateral MOSFET of the first embodiment, ion implantation is performed using the gate electrode as a mask. Therefore, even if an N-type resurf region of a two-step structure is to be formed, displacement of the mask will not occur. Consequently, the variation in the device characteristics is kept low.

Second Embodiment

A semiconductor device according to a second embodiment of the present invention will now be described. The same elements as those of the first embodiment are identified by the same reference numerals as those used for the first embodiment, and detailed descriptions thereof are omitted.

Figure 7:
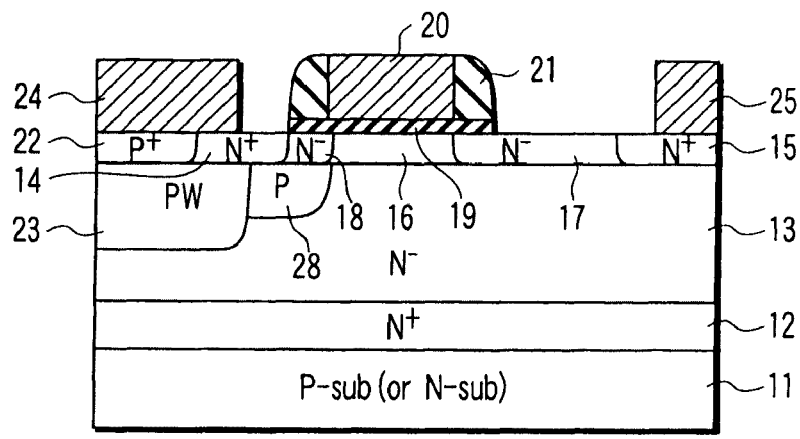
FIG. 7 is a cross-sectional view showing a lateral MOSFET according to a second embodiment of the present invention.

FIG. 7 is a cross-sectional view showing a lateral MOSFET according to a second embodiment of the present invention.

The lateral MOSFET of the second embodiment has a P-type semiconductor region 28, in addition to the elements of the lateral MOSFET of the first embodiment. The P-type semiconductor region 28 is formed in a part under the lightly doped diffusion region (LDD) 18 on the source side, in which part punch-through may be liable to occur. To form the P-type semiconductor region 28, the resist block for the ion implantation for forming the channel region is used. Thus, the punch-through under the diffusion region 18 in the source side can be prevented without increasing the number of masks in the manufacturing process.

Third Embodiment

A semiconductor device according to a third embodiment of the present invention will now be described. The same elements as those of the first embodiment are identified by the same reference numerals as those used for the first embodiment, and detailed descriptions thereof are omitted.

Figure 8:
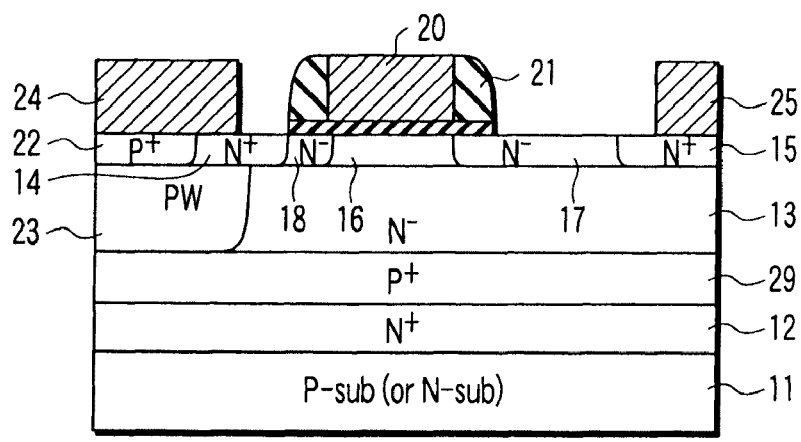
FIG. 8 is a cross-sectional view showing a lateral MOSFET according to a third embodiment of the present invention.

FIG. 8 is a cross-sectional view showing a lateral MOSFET according to a third embodiment of the present invention.

The lateral MOSFET of the third embodiment differs from the lateral MOSFET of the first embodiment in substrate structure. More specifically, a P+-type semiconductor layer 29 is formed between the N+-type semiconductor layer 12 and the N−-type semiconductor layer 13. The other structures and effects are the same as those of the first embodiment.

The present invention is applicable to other various substrate structures. Although the above embodiments relate to an N-channel MOSFET, the present invention can be applied to a P-channel MOSFET by inverting the conductivity type of each element.

According to the embodiments of the present invention, it is possible to provide a semiconductor device, which can operate at a high speed and with less variation of device characteristics.

The above embodiments can be worked independently or in combination. Further, the embodiments include inventions of various stages. Inventions of various stages can be extracted by appropriately combining a plurality of structural elements of the embodiments disclosed in this application.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:

forming a gate insulating film on a semiconductor region;
forming a gate electrode on the gate insulating film;
covering a drain region forming part of the semiconductor region with a protecting film, and performing ion implantation obliquely on the semiconductor region from a side of a source region forming part of the semiconductor region, thereby forming a channel region in a part of the semiconductor region under the gate electrode and lowering gradually an impurity concentration in the channel region from the source region towards the drain region;
covering the source region forming part of the semiconductor region with a protecting film, and implanting ions into the semiconductor region, thereby forming a resurf region; and
covering the resurf region with a protecting film, and performing ion implantation on the semiconductor region, thereby forming a source region and a drain region.

2. The method for manufacturing a semiconductor device according to claim 1, wherein in the performing ion implantation to form the channel region, impurities are introduced into the semiconductor region under the gate electrode in a self-aligning manner using the gate electrode as a mask, from a side of the source region at a predetermined angle with a normal to the semiconductor region.

3. The method for manufacturing a semiconductor device according to claim 1, further comprising covering the drain region forming part of the semiconductor region with a protecting film after forming the gate electrode and before forming the channel region, and performing ion implantation on the semiconductor region, thereby forming a diffusion region in the source region forming part of the semiconductor region.

4. The method for manufacturing a semiconductor device according to claim 1, further comprising forming side wall insulating films on side surfaces of the gate electrode after forming the resurf region and before forming the source region and the drain region.

* * * * *